US007602663B2

United States Patent
Chen et al.

(10) Patent No.: US 7,602,663 B2
(45) Date of Patent: Oct. 13, 2009

(54) FUSE CELL ARRAY WITH REDUNDANCY FEATURES

(75) Inventors: Zhanping Chen, Portland, OR (US); Jonathan P. Douglas, Portland, OR (US); Praveen Mosalikanti, Portland, OR (US); Kevin Zhang, Portland, OR (US); Gregory F. Taylor, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 334 days.

(21) Appl. No.: 11/644,381

(22) Filed: Dec. 22, 2006

(65) Prior Publication Data

US 2008/0151593 A1 Jun. 26, 2008

(51) Int. Cl.
*G11C 17/18* (2006.01)
(52) U.S. Cl. ............................. 365/225.7; 365/189.06; 365/189.07
(58) Field of Classification Search ............ 365/225.7, 365/96, 189.06, 189.07
See application file for complete search history.

(56) References Cited

U.S. PATENT DOCUMENTS

| 4,797,858 | A | 1/1989 | Wang et al. |
|---|---|---|---|
| 5,708,291 | A | 1/1998 | Bohr et al. |
| 5,983,367 | A | 11/1999 | Higuchi et al. |
| 6,574,135 | B1 | 6/2003 | Komatsuzaki |
| 6,580,655 | B2 | 6/2003 | Jacunski et al. |
| 6,914,837 | B2 | 7/2005 | Schroeder et al. |
| 7,012,827 | B2 * | 3/2006 | Chung .................... 365/94 |
| 7,417,913 | B2 * | 8/2008 | Chen et al. ............ 365/225.7 |
| 2007/0217247 | A1 * | 9/2007 | Chen et al. ............... 365/96 |

OTHER PUBLICATIONS

M. Alavi, et al., "A PROM Element Based on Salicide Agglomeration of Poly Fuses in a CMOS Logic Process," IEDM, 1997.

* cited by examiner

*Primary Examiner*—Pho M. Luu
(74) *Attorney, Agent, or Firm*—Blakely, Sokoloff, Taylor & Zafman LLP

(57) ABSTRACT

A plurality of fuse cells are arranged in an array. One or more fuse cells include a pair of fuse devices to output a pair of voltages, respectively, wherein the pair of fuse devices are redundantly programmed. A sense amplifier is coupled to the plurality of fuse cells to read the pair of voltage outputs from each of the plurality of fuse cells, respectively. A comparator circuit is coupled to the sense amplifier to compare the pair of voltage outputs for each of the plurality of fuse cells and to output the compared result.

18 Claims, 4 Drawing Sheets

FUSE CELL ARRAY WITH REDUNDANCY FEATURES

TECHNICAL FIELD

Embodiments of the invention relate generally to the field of integrated circuit design, and specifically to methods, apparatuses, and systems associated with and/or having fuse cells.

BACKGROUND

Fuse arrays are presently utilized in programmable read only memory (PROM) devices. PROM devices are typically used to configure and test integrated circuit devices, such as microprocessors, and to test and configure memory cache.

Typically, PROMs utilizing fuse arrays are generally written-to only once and retain their contents even when power is removed. PROM chips are conventionally written to by a specialized PROM test unit in which the PROM is programmed (e.g., often termed "burning the PROM"). In this configuration, the fuse array permanently sets a bit by locking or burning a fuse device in order to permanently store programs. Unfortunately, due to the failure of fuse devices to be properly "burned in", during PROM programming, a substantial percentage of PROM chips are often defective and are scrapped.

BRIEF DESCRIPTION OF THE DRAWINGS

Embodiments of the present invention will be readily understood by the following detailed description in conjunction with the accompanying drawings. Embodiments of the invention are illustrated by way of example and not by way of limitation in the figures of the accompanying drawings.

DETAILED DESCRIPTION OF EMBODIMENTS OF THE INVENTION

In the following description, the various embodiments of the invention will be described in detail. However, such details are included to facilitate understanding of the invention and to describe exemplary embodiments for employing the invention. Such details should not be used to limit the invention to the particular embodiments described because other variations and embodiments are possible while staying within the scope of the invention. Furthermore, although numerous details are set forth in order to provide a thorough understanding of the embodiments of the invention, it will be apparent to one skilled in the art that these specific details are not required in order to practice the embodiments of the invention. In other instances details such as, well-known methods, types of data, protocols, procedures, components, electrical structures and circuits, are not described in detail, or are shown in block diagram form, in order not to obscure the invention.

Further, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Figure 1:
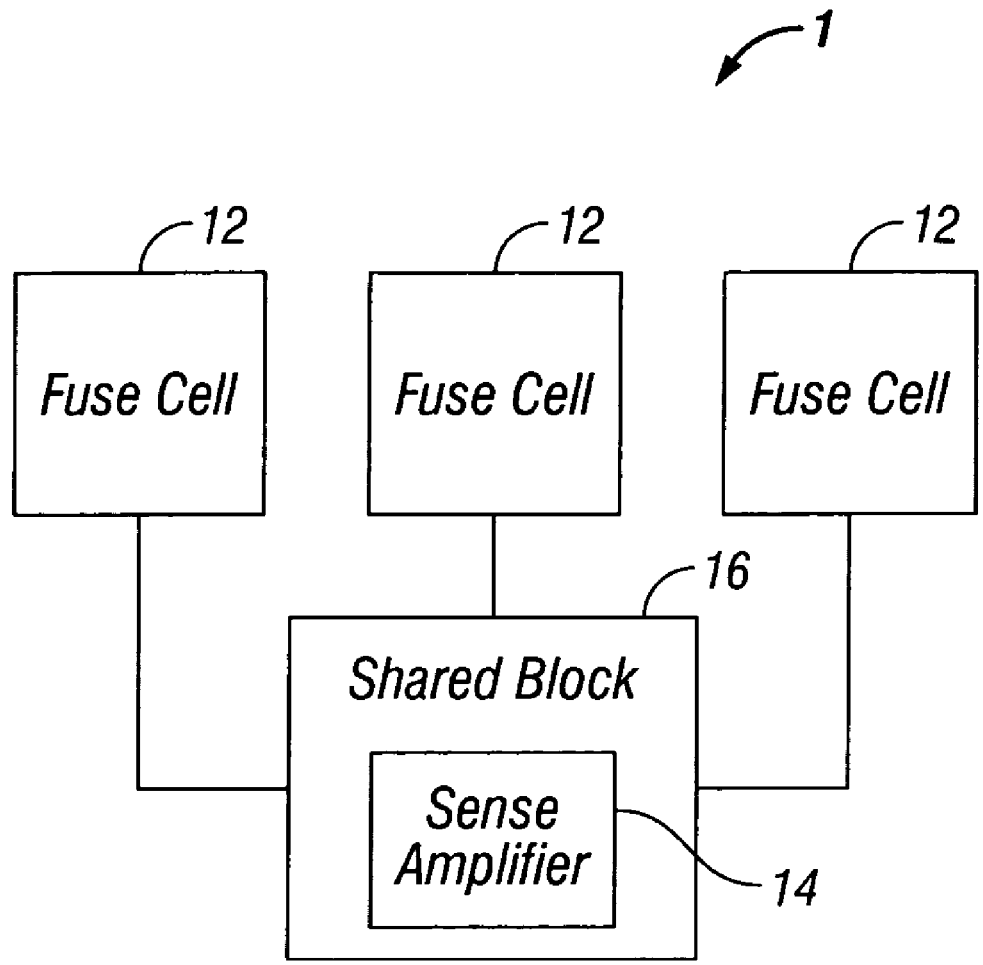
FIG. 1 is a diagram illustrating a fuse cell array according to one embodiment of the present invention.

FIG. 1 is a diagram illustrating a fuse cell array according to one embodiment of the present invention. In various ones of these embodiments, fuse array 1 may comprise a plurality of fuse cells 12 and a sense amplifier 14 coupled to the plurality of fuse cells 12. As shown, sense amplifier 14 may be part of a shared block 16 including various shared devices and/or circuitry (for example, high voltage protection circuitry to protect sense amplifier 14). In any case, plurality of fuse cells 12 may share sense amplifier 14. In some cases, sharing of sense amplifier 14 may vitiate or reduce the need for each fuse cell 12 to include its own dedicated sense amplifier 14. Thus, sharing sense amplifier 14 may realize, in some embodiments, an improved area-efficiency of an integrated circuit.

Figure 2:
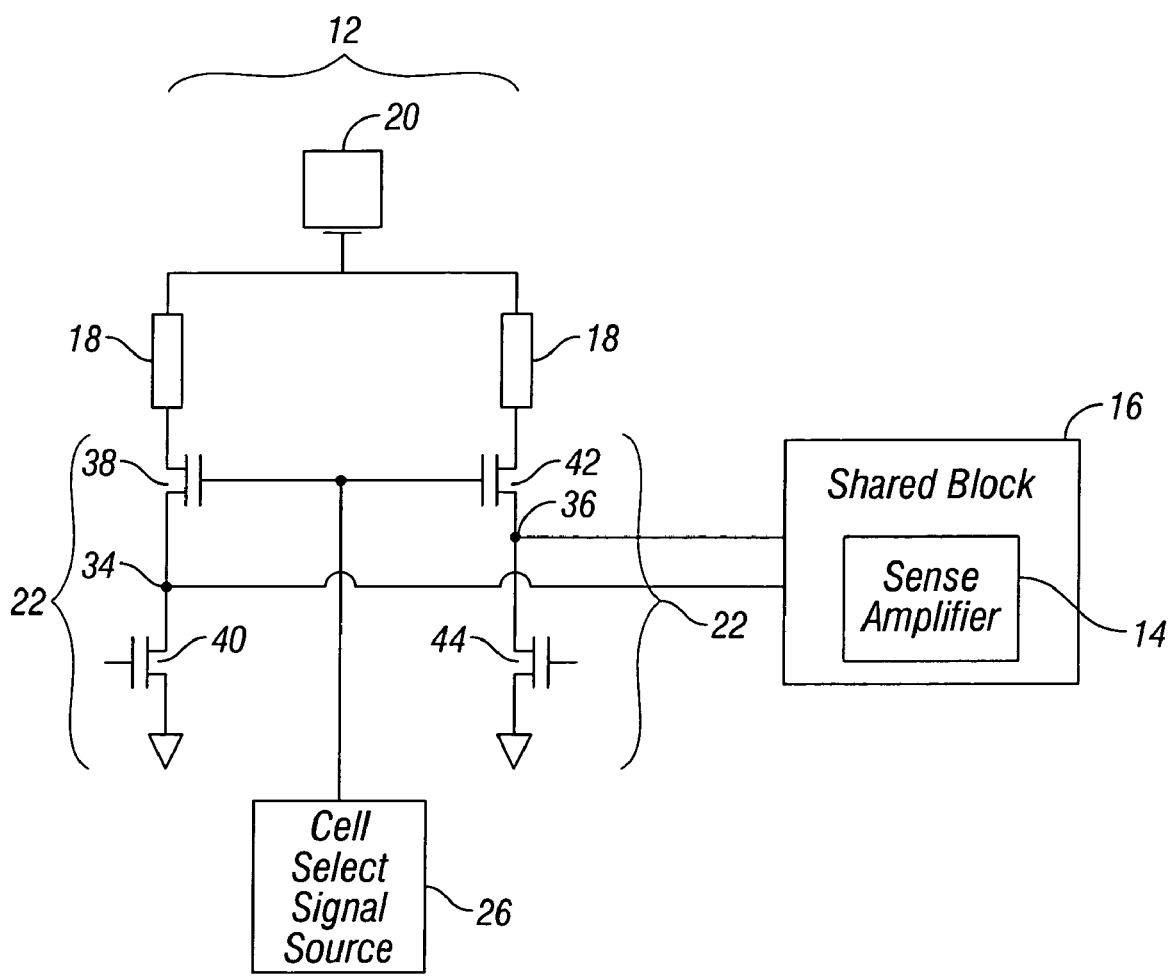
FIG. 2 is a diagram illustrating a fuse cell according to one embodiment of the present invention.

In various embodiments, plurality of fuse cells 12 may comprise one or more fuse devices 18. A fuse cell 12 in accordance with various embodiments of the present invention is shown in FIG. 2. Fuse devices 18 may be configured to output one or more voltages and, in some of these embodiments, one or more voltages may be sensed by sense amplifier 14 (discussed more fully below). Depending on the application, fuse devices 18 of fuse cell 12 may be coupled to a voltage source 20 to provide a voltage to fuse devices 18. In various ones of these embodiments, one or more of fuse devices 18 may receive voltage from voltage source 20, and output one or more voltages to sense amplifier 14.

In various embodiments, sense amplifier 14 may be variously formed and/or configured. For example, sense amplifier 14 may be a generic current mirror-based sense amplifier with one reference branch as a current source, and one or more current mirror branches as a repeater.

Depending on the application, sharing sense amplifier 14 may require scheduling of voltage output from plurality of fuse cells 12 in order for sense amplifier 14 to generate an accurate signal based on received voltage(s) from fuse cells 12. Put another way, sensing one fuse cell 12 at a time may be done in order to accurately read each fuse cell 12 because a sense amplifier 14 may not be able to parse through voltages to determine which fuse cell 12 output which voltage(s). Thus, in various embodiments, sense amplifier 14 may be coupled to plurality of fuse cells 12 to asynchronously sense one or more voltages output by plurality of fuse cells 12 so that one fuse cell 12 at a time may be selected for outputting voltage(s) to sense amplifier 14. For instance, a first of plurality of fuse cells 12 may be selected to output a first one or more voltages during a first time period, the first one or more voltage(s) being sensed by sense amplifier 14 and the unselected fuse cells 12 not outputting any voltage during the same first time period. Then, a second of plurality of fuse cells 12 may be selected to output a second one or more voltages during a second (different) time period, which is then sensed by sense amplifier 14 and the unselected fuse cells 12 not outputting any voltage during the second time period. A method in accordance with various embodiments of the present invention may continue these operations as necessary and/or desired.

Scheduling of voltage output from plurality of fuse cells 12 may comprise providing a cell select signal to one of plurality of fuse cells 12. In various ones of these embodiments, fuse array 1 may comprise cell select signal source 26, an embodiment of which is shown in FIG. 2. In various ones of these embodiments, cell select signal source 26 may be configured to selectively provide a cell select signal, for various purposes. For instance, in some embodiments, cell select signal may indicate to one or more fuse cells 12 that the fuse cell 12 is selected for sensing and/or programming. With respect to a sensing purpose, a cell select signal may indicate to one of plurality of fuse cells 12 to output voltage(s) for sensing by sense amplifier 14 and in some cases may comprise switching on one or more switchable conductive path devices 38, 40, 42, 44 of fuse cell 12. Methods in accordance with various embodiments may continue providing of cell select signal to one or more plurality of fuse cells 12, one or more at a time, depending on the application. Furthermore, in various embodiments, any number of fuse cells 12 may be incorporated into fuse array 1 and thus the previous steps may repeat accordingly.

With respect to fuse cells 12, fuse cells 12 may be variously configured in any manner known in the art. For instance, in various embodiments plurality of fuse cells 12 may comprise any number of fuse devices 18, depending on the application. An embodiment of a fuse cell 12 having two fuse devices 18 is shown in FIG. 2. Fuse cells 12 may be single-ended or double-ended fuse cells 12, also depending on the application. Further, fuse devices 18 of fuse cells 12 may be made from any material known in the art, including polysilicon and various metals. Again, fuse cells 12 may be variously formed and/or configured within the scope of the present invention.

Fuse array 1 may comprise programming circuitry 22, depending on the application. In various ones of these embodiments, programming circuitry 22 may be coupled to one of the fuse cells 12 and configured to program one or more of fuse devices 18 of fuse cells 12. For instance, in various embodiments and as shown in FIG. 2, first programming circuitry 22 may be configured to program first fuse device 18 and second programming circuitry 22 may be configured to program second fuse device 18.

Still referring to programming circuitry 22, in various embodiments one or more of programming circuitry 22 may include one or more switchable conductive path devices 38, 40, 42, 44. Depending on the application, switchable conductive path devices 38, 40, 42, 44 may be arranged in serial or parallel. Further, switchable conductive path devices 38, 40, 42, 44 may be PMOS or NMOS devices. In some of these embodiments, one or more PMOS or NMOS devices may have different threshold voltages from other PMOS or NMOS devices of fuse cell 12. In various embodiments, serially-arranging switchable conductive path devices 38, 40, 42, 44 may accrue certain benefits, including, for example, increased tolerance to high voltages. A programming circuitry 22 comprising serially-arranged switchable conductive path devices 38, 40, 42, 44 is shown in FIG. 2. As shown and in accordance with various embodiments of the present invention, programming circuitry 22 may comprise two such switchable conductive path devices 38, 40, 42, 44. In various embodiments, sense amplifier 14 may be coupled to one or more nodes 34, 36 disposed between switchable conductive path devices 38, 40, 42, 44. As shown, for example, sense amplifier 14 may be coupled to a first node 34 disposed between switchable conductive path devices 38 and 40, and may be further coupled to a second node 36 disposed between switchable conductive path devices 42 and 44. In some embodiments, sense amplifier 14 may be coupled, via node 34, 36, to one or more of the plurality of fuse cells 12 to sense one or more voltages output by the plurality of fuse cells 12. Although one embodiment of programming circuitry 22 is shown in FIG. 2, other embodiments of programming circuitry 22 may be variously configured to suit any particular application yet still remain within the scope of this invention.

Fuse cell 12 may comprise other circuitry or devices in various embodiments in accordance with the present invention. In various embodiments, fuse cell 12 may comprise circuitry including, for example, any one or more of additional sense amplifier circuitry, high voltage protection circuitry, various control signal sources, one or more flip-flop circuits to store the sensed data from sense amplifier 14, etc. In alternate embodiments, other various circuitry devices and/or design topologies may be enlisted, depending on the desired use and function of fuse cell 12.

It should be noted that the fuse devices 18 of FIG. 2 may operate as redundant elements. In particular, programming circuitry 22 may be utilized to program fuse devices 18 in the same manner such that fuse devices 18 operate in redundant fashion to one another. Sense amplifier 14 of shared block 16 may be utilized to read the redundantly programmed fuse devices 18. It should be appreciated that, in some embodiments, with reference to FIG. 2, only one branch with a redundantly programmed fuse device may be utilized, and the cell would still work, but yield problems may occur.

Further embodiments of the invention relate to an apparatus, a method, and a system for a fuse cell array. As will be described, a plurality of fuse cells are arranged in an array. One or more fuse cells include a pair of fuse devices to output a pair of voltages, respectively, wherein the pair of fuse devices are redundantly programmed. A sense amplifier is coupled to the plurality of fuse cells to read the pair of voltage outputs from each of the plurality of fuse cells, respectively. The sense amplifier may have a common reference branch to provide a reference resistance and two or more mirrored branches. The resistances in the redundant mirrored branches are then compared with the reference branch and output the compared results Embodiments of the invention relate to defining two levels of redundancy in an array of fuse cells 12 (e.g., such as in a programmable read only memory (PROM)) for improving the yield of such programmable circuits. As previously discussed with respect to FIG. 2, at the bit-level, a level of redundancy is provided by fuse cell 12, because fuse devices 18 may be programmed in a redundant fashion. At another level, as will be discussed, further redundancy is provided, at a row-column level, for an array of fuse cells 12.

Figure 3:
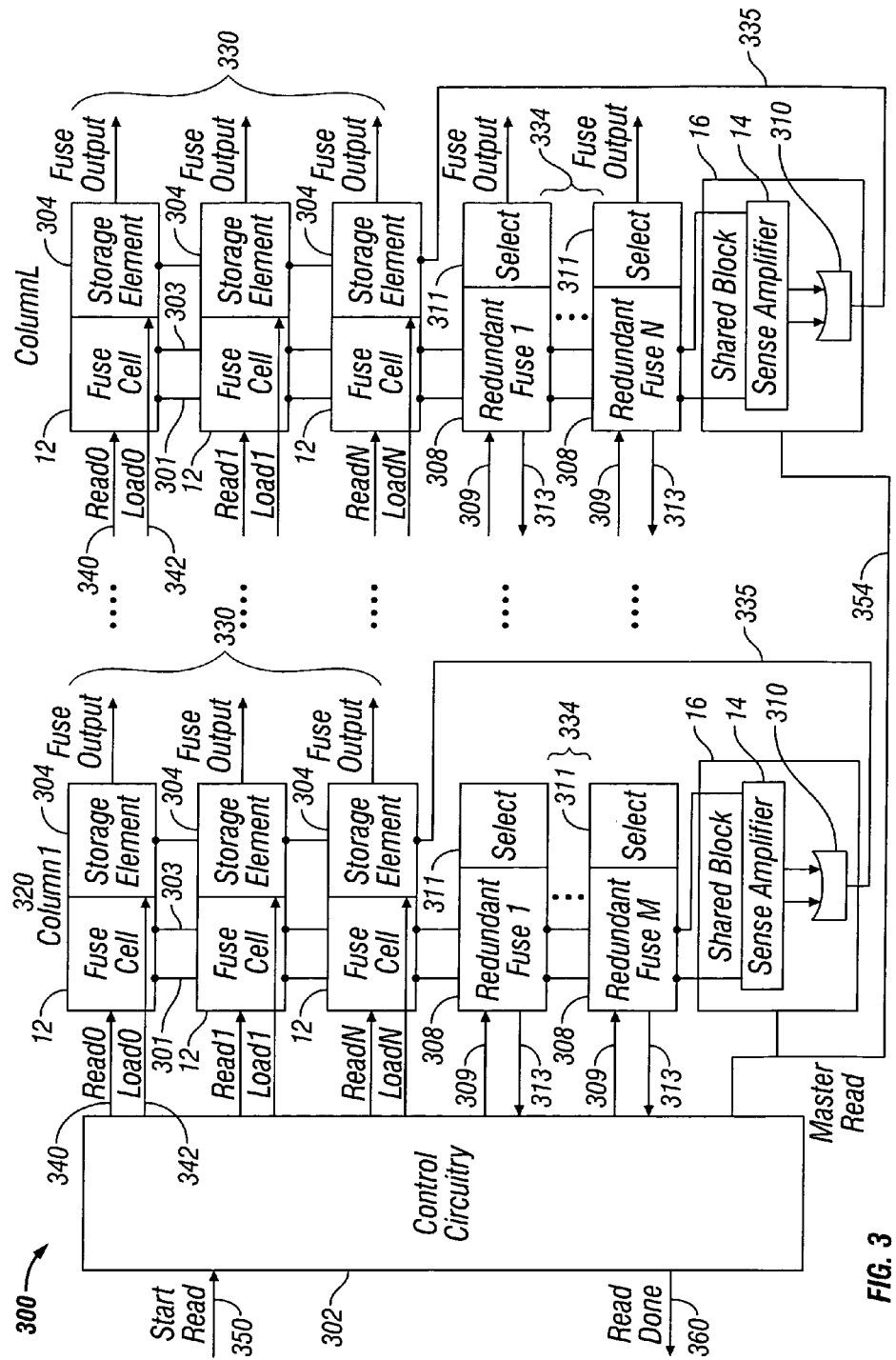
FIG. 3 is a diagram illustrating a fuse cell array according to one embodiment of the present invention.

With reference now to FIG. 3, FIG. 3 is a diagram illustrating a fuse cell array 300 according to one embodiment of the present invention. Particularly, FIG. 3 shows a programmable array of fuse cells 300 that may be constructed as an array of fuse cells 12 arranged in rows and columns (e.g., for use as a PROM). Each fuse cell 12 may contain the redundantly programmable fuse devices 18 (previously discussed) in conjunction with a sequential storage element 304 to store a read result. However, it should be appreciated that the storage element 304 does not have to be in this array. For example, the storage element can be one cell of a regular memory array wherein each cell is a storage element. Further, it should be appreciated that storage elements may be an SRAM cell, a flip-flop circuit, or other types of storage device As can be seen in FIG. 3, there are a pre-defined number of normal rows (Row 0-Row N) 330 and a pre-defined number of redundant fuse rows 334 (Redundant Fuse 1-Redundant Fuse M). These rows span a pre-defined number of columns (Column 1-Column L).

As will be described, the fuse cells 12 are simultaneously read out by row, one row at a time in asynchronous fashion. With one row read at a time, each column shares a shared block circuitry 16 and corresponding sense amplifier 14.

When all the rows have been read (including the redundant fuse rows 334), the sequential storage element 304 associated with each fuse cell 12 holds the final value of the bit that is to be loaded into an integrated circuit device.

More particularly, referring to Column 1 320 as an example, the operation of programmable fuse cell array 300 will be discussed. It should be appreciated that each of the columns, Column 1-Column L, operate in a similar manner. Looking at Column 1 320, a plurality of regular rows 330 and a plurality of redundant rows 334 coupled to control circuitry 302 and shared block 16 are illustrated.

In particular, at the bottom Column 1 320 is a shared block 16 that includes a sense amplifier 14 that reads each dual fuse cell 12 output along lines 301 and 303, respectively. Moreover, the output of the sense amplifier 14 of the bits read from the dual fuse cell outputs are OR-d by an OR circuit 310 to provide bit-level redundancy for each fuse cell 12. This value from OR circuit 310 is then written along line 335 back to the corresponding storage element 304 for storage at the corresponding storage element 304.

As can be seen at the bottom of Column 1 320, redundancy rows 334 including redundant fuse cells 308 may be present. The redundant fuse cells 308 of the redundancy rows 334 do not include a storage element. Each redundant fuse cell 308 has selection logic 311 which indicates whether it is to be used, its value, and what row it replaces. Select logic 311 for each redundant fuse cell 308 is programmed with a fuse cell replacement value and a fuse cell row value, which indicates a value and a row to be replaced.

Reading of the fuse cell array 300 is controlled by control circuitry 302 that provides control signals to asynchronously read and load each of the regular rows 330 and whether or not to activate the redundant rows 334. Particularly, as to the regular rows 330, as can be seen in FIG. 3, control circuitry 302 may utilize read and load signals 340 and 342 (e.g., Read 0-Read N and Load 0-Load N) to control the reading and loading of each respective fuse cell 12 and storage element 304, respectively.

With the structural components of the fuse cell array 300 previously described, the basic functionality of fuse cell array 300 will be described as follows. Based upon a start read signal 350 to control circuitry 302, control circuitry 302 initiates a process to read fuse cell array 300. Particularly, control circuitry 302 triggers upon the start read signal 350 and starts a read sequence. Control circuitry 302 first sends out read and load signals 340 and 342 for row 0 (e.g., Read 0, Load 0) in conjunction with a master read signal 354 that enables sense amplifier 14 to read the programmed voltage outputs along lines 301 and 303 from fuse cell 12.

The read signal 340 is used to select the respective fuse cell 12 in row 0 for reading and the load signal 342 is used to latch the OR'd sense amplifier output 14 into the storage element 304 of row 0 along line 335. After read 0 and load 0 is de-asserted, the control circuitry 302 then asserts read 1 and load 1 for row 1 of the normal rows 330. This process continues through all the normal rows (Row 0-Row N) in sequential fashion.

Afterwards, control circuitry 302 enables read signal 309 to read redundant row 1. This causes the redundant fuse 308 in redundant row 1 to be read along line 313. The control circuitry 302 decodes the select logic 311 and if a non-zero value is returned, it will assert a load signal 313 corresponding to the decoded fuse cell replacement value and the decoded fuse cell row value, which indicates a value and a row to be replaced. The control circuitry via a load signal 342 will then latch the redundant row values into the storage element 304 for the row indicated by the de-code, for which it is to replace. This process continues for all the redundant rows (redundant rows 1-M 334).

It should be appreciated that the above-described process for column 1 320 is carried out in parallel for each respective column (Column 1-Column L) for the complete fuse cell array 300. After the fuse cell array 300 is fully read, control circuitry 302 asserts a read done signal 360 to indicate that the fuse cell array 300 now holds all the valid bit values.

Figure 4:
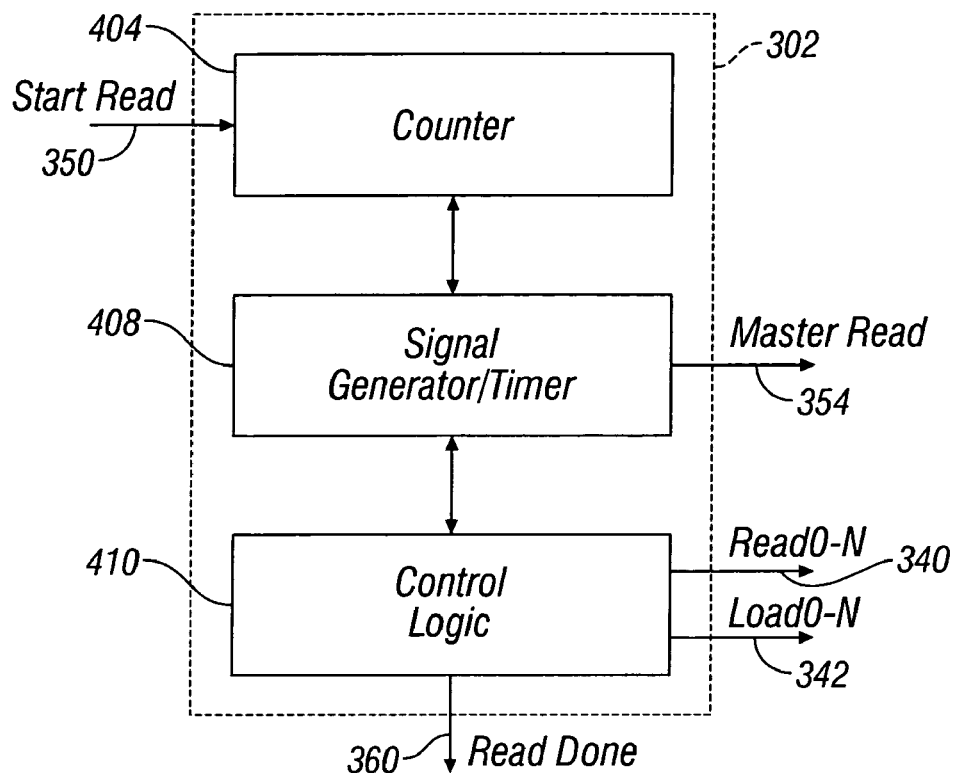
FIG. 4 is a diagram illustrating control circuitry for the fuse cell array of FIG. 3 according to one embodiment of the present invention.

Turning now to FIG. 4, FIG. 4 is a block diagram that illustrates components of control circuitry 302 of FIG. 3, according to one embodiment of the invention. In this example, a counter 404 is coupled to a signal generator/timer 408 and signal generator/timer 408 is coupled to control logic 410. The counter 404 may be activated by the start read signal 350. Signal generator/timer 408 may be utilized to clock the counter 404 and to control the duration of the master read signal 354. Further, each rising edge of the signal generator/timer 408 will advance the counter 404 by one tick, which activates the master read signal for each shared block 16 and each read and load signal on a row-by-row basis through control logic 410. As shown in FIG. 4, based upon this clocking, control logic 410 outputs a corresponding read and load signal 340 and 342 (e.g., Read 0-N, Load 0-N).

Additionally, control logic 410 may also decode the redundancy select bits and drive all the correct row read and load signals. Upon completion of the reading of the fuse cell array 300, control logic 410 outputs the read done signal.

In one embodiment, in usage, the fuse cell array 300 may be programmed to a pre-determined set of values. For example, if a fuse cell 12 is to be a "1", then both fuse devices 18 are programmed. The fuse cell array 300 will then be read out after programming.

It should be noted that if any single fuse device 18 in a fuse cell 12 was not programmed correctly, but the other fuse device 18 was, then the fuse cell 12 will still read a "1" correctly. Therefore, this provides a first level of bit-level redundancy.

However, if both fuse devices 18 fail to be programmed correctly, or are either stuck or defective, then the fuse cell 12 will read an incorrect value. However, the fuse cell array 300 may be compared to an intended result, and each failing bit may be recorded, along with the row it is in, and for each row with a bad bit, a redundant fuse 308 of a redundant row 334, as previously discussed, may then be programmed with the original values and selection bits select logic 311 of the redundant fuse 308 may be programmed with the address of the row to be replaced. This may be done for each row that has an incorrect value.

Accordingly, two levels of redundancy and correction ability are provided, both at the bit-level and row-level. Moreover, column-level redundancy can be also provided the same way as row redundancy.

Figure 5:
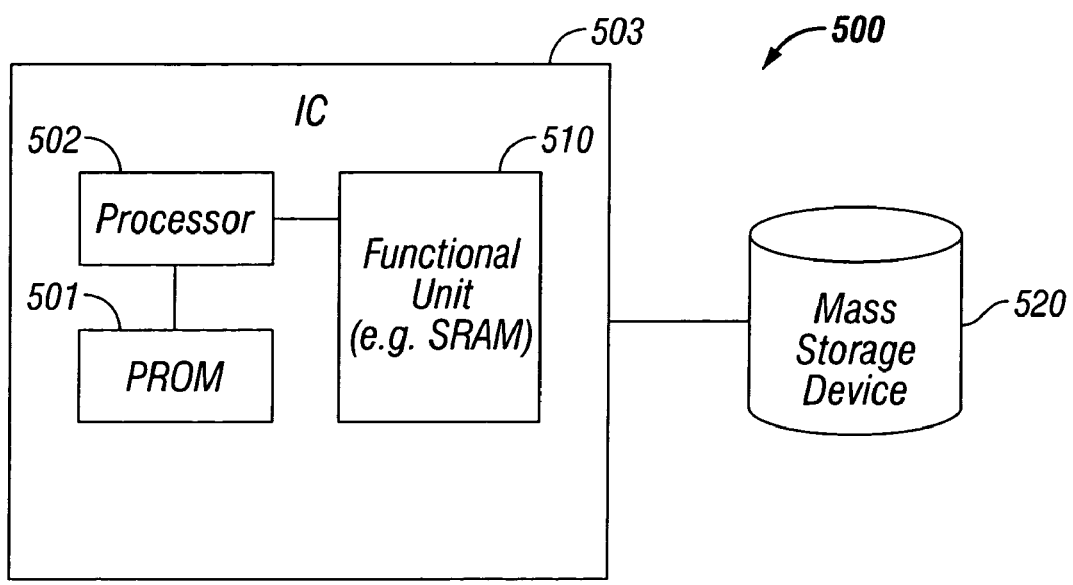
FIG. 5 is a diagram illustrating a system incorporating a PROM utilizing a fuse cell array according to one embodiment of the present invention.

Turning to FIG. 5, FIG. 5 is a diagram illustrating a system incorporating a programmable read only memory (PROM). More particularly, FIG. 5 illustrates a system 500 incorporating a PROM 501 having one or more fuse cell arrays 300 in accordance with various embodiments of the present invention.

As shown, system 500 may comprise an integrated circuit 503 having PROM 501, and one or more mass storage devices 520 coupled to the integrated circuit 503. In various embodiments, integrated circuit 503 may be a microprocessor or an Application Specific Integrated Circuit (ASIC). As discussed previously, PROM 501 may comprise a fuse cell array 300 including a plurality of fuse cells 12. In some of these embodiments, fuse cell array 300 may be configured to output one or more voltages to configure the integrated circuit 503 and/or functional units 510 of the integrated circuit, such as static random access memory (SRAM). Mass storage device 520 and integrated circuit 503, except for the novel fuse cell 12 and fuse cell array 300 of PROM 501 described herein, may represent a broad range of these elements known in the art. System 500 may be embodied in a broad range of form factors from servers, to desktop, laptop, tablet, and/or handheld. Further, system 500 may be endowed with various operating systems and/or applications to solve various computing and/or communication problems.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

The invention claimed is:

1. An apparatus, comprising:
    a plurality of fuse cells arranged in an array, one or more fuse cells including a pair of fuse devices to output a pair of voltages, respectively, the pair of fuse devices being redundantly programmed;
    a sense amplifier coupled to the plurality of fuse cells to read the pair of voltage outputs from the plurality of fuse cells, respectively;
    a comparator circuit coupled to the sense amplifier to compare the pair of voltage outputs for each of the plurality of fuse cells and to output the compared result;
    a storage element associated with each fuse cell, the storage element to store the compared result for each fuse cell; and
    a control circuit coupled to the plurality of fuse cells, the control circuit to output asynchronous read signals to each fuse cell to control the reading of each respective fuse cell in an asynchronous manner.

2. The apparatus of claim 1, wherein the control circuit is coupled to the plurality of storage elements, the control circuit to output asynchronous load signals to each storage element to control the loading of each storage element with the compared result for each associated fuse cell.

3. The apparatus of claim 2, wherein the control circuit further comprises a counter and a signal generator to asynchronously generate the read and load signals.

4. The apparatus of claim 1, further comprising one or more redundant fuses, the redundant fuse being programmed to replace a defective fuse cell.

5. The apparatus of claim 4, wherein the redundant fuse cell is programmed with a fuse cell replacement value and a fuse cell row value, the control circuit to decode the fuse cell row value and to program the storage element of the associated fuse cell having the decoded fuse cell row value within the array with the fuse cell replacement value.

6. The apparatus of claim 1, wherein the comparator circuit is an OR circuit.

7. The apparatus of claim 1, wherein the plurality of fuse cells arranged in the array are arranged in a plurality of rows and columns, wherein for each column, a sense amplifier and a comparator circuit are coupled to each fuse cell of each row for the column.

8. A method comprising:
    reading a pair of voltage outputs from a fuse cell of a plurality of fuse cells arranged in an array in which the plurality of fuse cells are read in an asynchronous manner;
    comparing the read pair of voltage outputs from each of the plurality of fuse cells to generate a compared result;
    storing the compared result in a storage element associated with the fuse cell;
    applying an asynchronous read signal to each fuse cell to control the reading of each respective fuse cell in an asynchronous manner; and
    applying an asynchronous load signal to each storage element associated with each fuse cell to control the loading of each storage element with the compared result for each associated fuse cell;
    wherein each fuse cell includes a pair of fuse devices to generate a pair of voltage outputs, respectively, the pair of fuse devices being redundantly programmed.

9. The method of claim 8, further comprising programming one or more redundant fuses to replace a defective fuse cell.

10. The method of claim 9, further comprising:
    programming the redundant fuse cell with a fuse cell replacement value and a fuse cell row value;
    determining the fuse cell within the array corresponding to the fuse cell row value; and
    programming the storage element associated with the fuse cell with the fuse cell replacement value.

11. The method of claim 8, wherein comparing the read pair of voltage outputs from each of the plurality of fuse cells includes performing an OR operation.

12. The method of claim 8, wherein the plurality of fuse cells arranged in the array are arranged in a plurality of rows and columns, wherein for each column, a sense amplifier and a comparator circuit are coupled to each fuse cell of each row for the column.

13. A system comprising:
    an integrated circuit that includes a:
        a plurality of fuse cells arranged in an array, one or more fuse cells including a pair of fuse devices to output a pair of voltages, respectively, the pair of fuse devices being redundantly programmed;
        a sense amplifier coupled to the plurality of fuse cells to read the pair of voltage outputs from the plurality of fuse cells, respectively;
        a comparator circuit coupled to the sense amplifier to compare the pair of voltage outputs for each of the plurality of fuse cells and to output the compared result;
        a storage element associated with each fuse cell, the storage element to store the compared result for each fuse cell;
        a control circuit coupled to the plurality of fuse cells, the control circuit to output asynchronous read signals to each fuse cell to control the reading of each respective fuse cell in an asynchronous manner; and
    one or more mass storage devices coupled to the integrated circuit.

14. The system of claim 13, wherein the control circuit is coupled to the plurality of storage elements, the control circuit to output asynchronous load signals to each storage element to control the loading of each storage element with the compared result for each associated fuse cell.

15. The system of claim 14, wherein the control circuit further comprises a counter and a signal generator to asynchronously generate the read and load signals.

16. The system of claim 14, further comprising one or more redundant fuses, the redundant fuse being programmed to replace a defective fuse cell.

17. The system of claim 16, wherein the redundant fuse cell is programmed with a fuse cell replacement value and a fuse cell row value, the control circuit to decode the fuse cell row value and to program the storage element of the associated fuse cell having the decoded fuse cell row value within the array with the fuse cell replacement value.

18. The system of claim 13, wherein the comparator circuit is an OR circuit.

* * * * *